US009691490B2

(12) United States Patent
Choi et al.

(10) Patent No.: US 9,691,490 B2
(45) Date of Patent: Jun. 27, 2017

(54) SEMICONDUCTOR MEMORY DEVICE INCLUDING DUMMY MEMORY CELLS AND MEMORY SYSTEM INCLUDING THE SAME

(71) Applicant: SK hynix Inc., Icheon-si, Gyeonggi-do (KR)

(72) Inventors: Eun Seok Choi, Seongnam-si (KR); Jung Seok Oh, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/450,399

(22) Filed: Aug. 4, 2014

(65) Prior Publication Data

US 2015/0228352 A1    Aug. 13, 2015

(30) Foreign Application Priority Data

Feb. 7, 2014   (KR) .......................... 10-2014-0014296

(51) Int. Cl.
*G11C 16/04* (2006.01)
*G11C 16/28* (2006.01)
*G11C 29/00* (2006.01)

(52) U.S. Cl.
CPC .......... *G11C 16/28* (2013.01); *G11C 16/0483* (2013.01); *G11C 29/76* (2013.01); *G11C 29/82* (2013.01); *G11C 2229/723* (2013.01); *G11C 2229/743* (2013.01)

(58) Field of Classification Search
CPC ................. G11C 16/28; G11C 11/5642; G11C 2211/5634; G11C 29/24

USPC ....................................................... 365/185.2
See application file for complete search history.

(56) References Cited

U.S. PATENT DOCUMENTS

| 6,078,525 | A | * | 6/2000 | Kuriyama | ............ | G11C 16/107 |
| | | | | | | 365/185.09 |
| 2006/0233014 | A1 | * | 10/2006 | Oh | ................................ | 365/154 |
| 2010/0290296 | A1 | * | 11/2010 | Lee | ................................ | 365/200 |
| 2010/0290297 | A1 | * | 11/2010 | Kyung | ................. | G11C 29/816 |
| | | | | | | 365/200 |
| 2012/0039130 | A1 | * | 2/2012 | Yoon et al. | ............... | 365/185.18 |

FOREIGN PATENT DOCUMENTS

| KR | 1020060101610 A | 9/2006 |
| KR | 1020120109244 A | 10/2012 |

* cited by examiner

*Primary Examiner* — Khamdan Alrobaie
(74) *Attorney, Agent, or Firm* — William Park & Associates Ltd.

(57) ABSTRACT

The semiconductor memory device includes a memory cell array including a first plurality of normal memory cells and a second plurality of dummy memory cells in a stacked configuration over a substrate, a first plurality of normal word lines electrically coupled to the first plurality of normal memory cells, and a second plurality of dummy word lines electrically coupled to the second plurality of dummy memory cells, wherein the first plurality of normal memory cells includes at least one bad memory cell and each of the at least one bad memory cells are is replaced with a dummy memory cell from among the second plurality of dummy memory cells.

15 Claims, 11 Drawing Sheets

FIG. 9

| WL | Voltage |
|---|---|
| DDWL3 | Vpdm0 (Vrdm0) |
| DDWL2 | Vpdm1 (Vrdm1) |
| DDWL1 | Vpdm2 (Vrdm2) |
| NWL1 ~ NWLp, NWLp+3 ~ NWLn | Vppass (Vrpass) |
| NWLp+1, NWLp+2 | |
| SDWL3 | Vpgm (Vread) |
| SDWL2 | Vpdm2 (Vrdm2) |
| SDWL1 | Vpdm1 (Vrdm1) |

FIG. 10

| WL | Voltage |
|---|---|
| DDWL3 | Vss |
| DDWL2 | |
| DDWL1 | |
| NWL1 ~ NWLp, NWLp+3 ~ NWLn | |
| NWLp+1, NWLp+2 | |
| SDWL3 | |
| SDWL2 | |
| SDWL1 | |

SEMICONDUCTOR MEMORY DEVICE INCLUDING DUMMY MEMORY CELLS AND MEMORY SYSTEM INCLUDING THE SAME

CROSS-REFERENCE TO RELATED APPLICATION

This application claims priority to and the benefit of Korean Patent Application No. 10-2014-0014296, filed on Feb. 7, 2014, the disclosure of which is incorporated herein by reference in its entirety.

BACKGROUND

Embodiments relate to an electronic device, and more particularly, to a semiconductor memory device and a memory system including the same.

DISCUSSION OF RELATED ART

Semiconductor memory devices are memory devices implemented using semiconductor materials, such as for example silicon (Si), germanium (Ge), gallium arsenide (GaAs), indium phosphide (InP). The semiconductor memory devices are generally classified as volatile memory devices or as nonvolatile memory devices.

A volatile memory device is a memory device where stored data is lost when the power supplied to the volatile memory device is interrupted. Examples of volatile memory devices include, but are not limited to, a static random access memory (SRAM), a dynamic RAM (DRAM), and a synchronous DRAM (SDRAM). A nonvolatile memory device is a memory device that retains stored data when the power supplied to the nonvolatile memory device is interrupted. Examples of nonvolatile memory devices include, but are not limited to, a read only memory (ROM), a programmable ROM (PROM), an erasable programmable ROM (EPROM), an electrically erasable programmable ROM (EEPROM), a flash memory, a phase-change RAM (PRAM), a magnetic RAM (MRAM), a resistive RAM (RRAM), a ferroelectric RAM (FRAM), etc. The flash memories are generally classified as a NOR type flash memory device or as a NAND type flash memory device.

SUMMARY OF THE INVENTION

An embodiment of a semiconductor memory device includes a memory cell array including a first plurality of normal memory cells and a second plurality of dummy memory cells in a stacked configuration over a substrate, a first plurality of normal word lines electrically coupled to the first plurality of normal memory cells, and a second plurality of dummy word lines electrically coupled to the second plurality of dummy memory cells, wherein the first plurality of normal memory cells includes at least one bad memory cell and each of the at least one bad memory cell is replaced with a dummy memory cell from among the second plurality of dummy memory cells.

An embodiment of a semiconductor memory device includes a plurality of cell strings electrically coupled to a plurality of drain select lines, respectively, and extending in a row direction and arranged in a column direction—each of the plurality of cell strings including a first plurality of normal memory cells and a second plurality of dummy memory cells in a stacked configuration over a substrate, a first plurality of normal word lines electrically coupled to the first plurality of normal memory cells, and a second plurality of dummy word lines electrically coupled to the plurality of dummy memory cells, wherein, the first plurality of normal memory cells includes at least one bad memory cell and each of the at least one bad memory cells is replaced with a dummy memory cell from among the second plurality of dummy memory cells.

An embodiment of a memory system includes a semiconductor memory device, and a controller configured to control at least one operation of the semiconductor memory device, wherein the semiconductor memory device includes a memory cell array including a first plurality of normal memory cells and a second plurality of dummy memory cells in a stacked configuration over a substrate, a first plurality of normal word lines electrically coupled to the first plurality of normal memory cells and a second plurality of dummy word lines electrically coupled to the second plurality of dummy memory cells, wherein the first plurality of normal memory cells include at least one bad memory cell and each the at least one bad memory cells are replaced with a dummy memory cell from among the second plurality of dummy memory cells.

BRIEF DESCRIPTION OF THE DRAWINGS

FIG. 9 is a table detailing the voltages that are applied to the dummy word lines and to the normal word lines when a program operation or a read operation is performed following the replacement of the bad memory cells in accordance with the method described with reference to FIG. 8;

FIG. 10 is a table detailing the voltages that are applied to the dummy word lines and to the normal word lines when an erase operation is performed following the replacement of the bad memory cells in accordance with the method described with reference to FIG. 8;

DETAILED DESCRIPTION OF EMBODIMENTS

Figure 1:
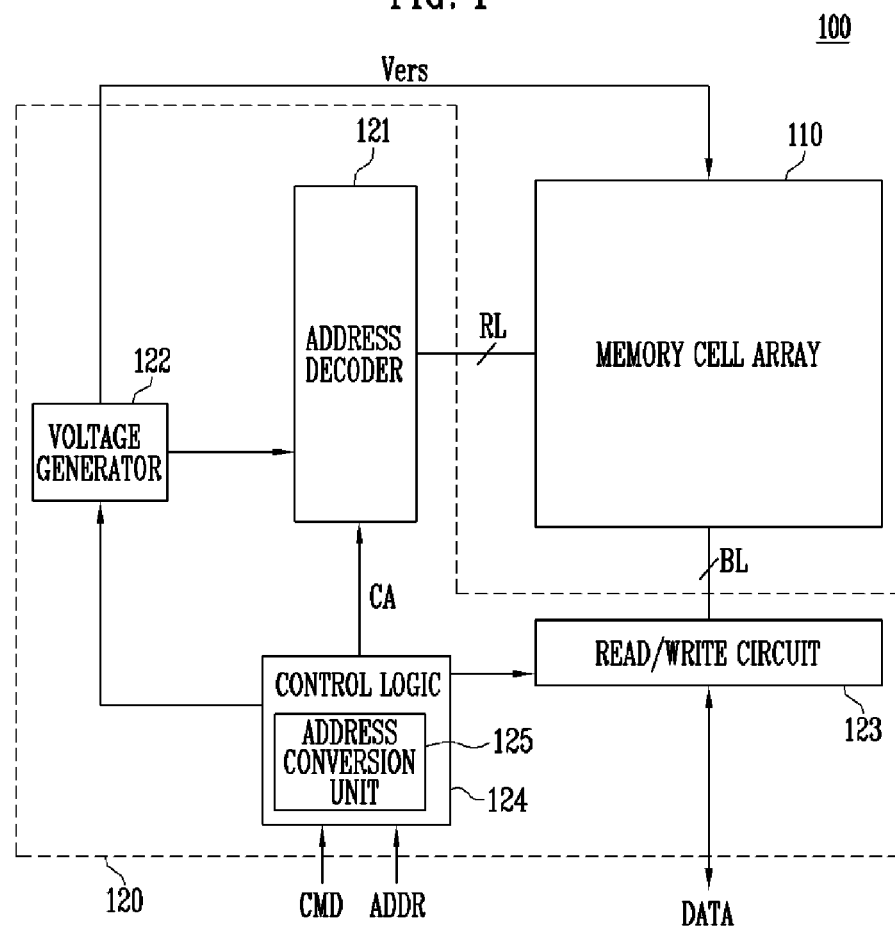
FIG. 1 is a block diagram representation of an embodiment of a semiconductor memory device.

FIG. 1 is a block representation of an embodiment of a semiconductor memory device 100.

The semiconductor memory device 100 includes a memory cell array 110 and a peripheral circuit 120.

The memory cell array 110 is electrically coupled to the peripheral circuit 120 via row lines RL and bit lines BL.

The memory cell array 110 includes a plurality of memory blocks. Each of the plurality of memory blocks includes a plurality of cell strings. Each of the plurality of cell strings includes a plurality of memory cells stacked above a substrate. In an embodiment, each of the plurality of memory cells is a nonvolatile memory cell. In an embodiment, each of the plurality of memory cells may be defined as a single-level cell or as a multi-level cell. The memory cell array 110 will be described below with reference to FIGS. 2, 3 and 4.

Repair information is stored in at least one of the plurality of memory blocks. The repair information includes information regarding bad memory cells. The reliability of the bad memory cells is typically uncertain and may be processed as a bad area. Bad memory cells may be replaced with other memory cells.

The peripheral circuit 120 loads the repair information from the memory cell array 110 and replaces the bad memory cells with other memory cells in accordance with the repair information.

The peripheral circuit 120 includes an address decoder 121, a voltage generator 122, a read/write circuit 123 and a control logic 124.

The address decoder 121 is electrically coupled to the memory cell array 110 via the row lines RL. The row lines RL include drain select lines, word lines, a source select line and a common source line. In an embodiment, the row lines RL may include a pipe select line.

The address decoder 121 is configured to drive the row lines RL under the control of the control logic 124. The address decoder 121 receives a conversion address CA from the control logic 124.

In an embodiment, when a program operation or a read operation is performed, the conversion address CA includes a block address and a row address. The address decoder 121 is configured to decode the block address of the received conversion addresses CA. The address decoder 121 selects the memory block associated with the decoded block address. The address decoder 121 is configured to decode the row address of the received conversion address CA. The address decoder 121 applies voltages received from the voltage generator 122 to the row lines RL of the selected memory block, and then selects one drain select line and one word line associated with the decoded row address.

In an embodiment, when an erase operation is performed, the conversion address CA includes a block address. The address decoder 121 decodes the block address, and selects the memory block associated with the decoded block address. The address decoder 121 applies a voltage received from the voltage generator 122 when an erase voltage Vers is applied to the memory cell array 110. An example of the voltage includes, but is not limited to, a ground voltage that is applied to the row lines RL that are electrically coupled to the selected memory block.

In an embodiment, the address decoder 121 may include a block decoder, a row decoder, and an address buffer.

The voltage generator 122 operates under the control of the control logic 124. The voltage generator 122 is configured to generate a plurality of voltages using an external voltage received at the semiconductor memory device 100.

In an embodiment, the voltage generator 122 may include a circuit configured to regulate the received external voltage and generate a power voltage. In an embodiment, the voltage generator 122 may include a plurality of pumping capacitors and generate a plurality of voltages by selectively activating the plurality of pumping capacitors to receive the power voltage.

The read/write circuit 123 is electrically coupled to the memory cell array 110 via the bit lines BL. The read/write circuit 123 operates under the control of the control logic 124.

When a program operation and a read operation are performed, the read/write circuit 123 may exchange data DATA with an external device that is external to the semiconductor memory device 100 or with an input/output buffer (not shown) of the semiconductor memory device 100. When a erase operation is performed, the read/write circuit 123 may float the bit lines BL.

In an embodiment, the read/write circuit 123 may include page buffers (or page registers), a column select circuit and the like.

The control logic 124 is electrically coupled to the address decoder 121, the voltage generator 122 and the read/write circuit 123. The control logic 124 receives a command CMD and a physical address ADDR from the external device or from the input/output buffer (not shown) of the semiconductor memory device 100. The control logic 124 is configured to control the one or more of the operations of the semiconductor memory device 100 in response to the command CMD. Examples of the command CMD include, but are not limited to, a program operation command, a read operation command and an erase operation command.

The control logic 124 includes an address conversion unit 125. The address conversion unit 125 stores the repair information loaded from the memory cell array 110. A bad area of the memory cell array 110 and the memory cells that will be used to replace the bad area are specified in the repair information.

The address conversion unit 125 receives the physical address ADDR. If the physical address ADDR corresponds to a bad area, the address conversion unit 125 provides a conversion address CA associated with the memory cells that will be used to replace the bad area. If the physical address ADDR does not correspond to a bad area, the address conversion unit 125 provides the physical address ADDR as a conversion address CA.

The semiconductor memory device 100 may include an input/output buffer (not shown). The input/output buffer receives the command CMD and the physical address ADDR from the external device and transmits the received command CMD and physical address ADDR to the control logic 124. The input/output buffer is configured to transmit data DATA received from the external device to the read/write circuit 123 and data DATA received from the read/write circuit 123 to the external device.

In an embodiment, the semiconductor memory device 100 may be a flash memory device.

Figure 2:
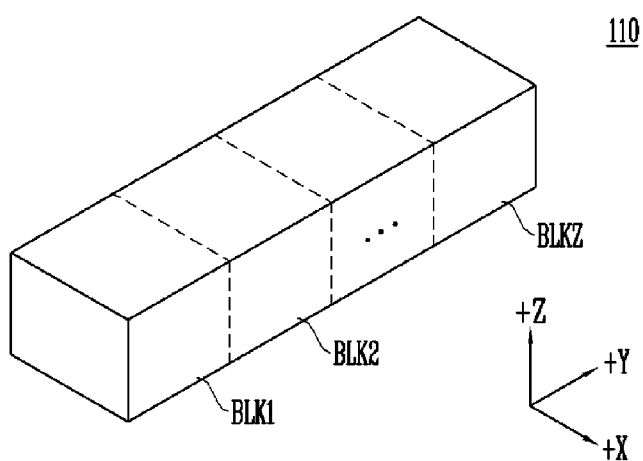
FIG. 2 is a block diagram representation of a memory cell array shown in FIG. 1.

FIG. 2 is a block diagram representation of the memory cell array 110 shown in FIG. 1.

The memory cell array 110 includes a plurality of memory blocks BLK1-BLKz. Each memory block has a 3-dimensional structure. Each memory block includes a plurality of memory cells stacked above a substrate. The plurality of memory cells are arranged along a +X direction, a +Y direction, and a +Z direction. The structure of a memory block is described below with reference to FIGS. 3 and 4.

Figure 3:
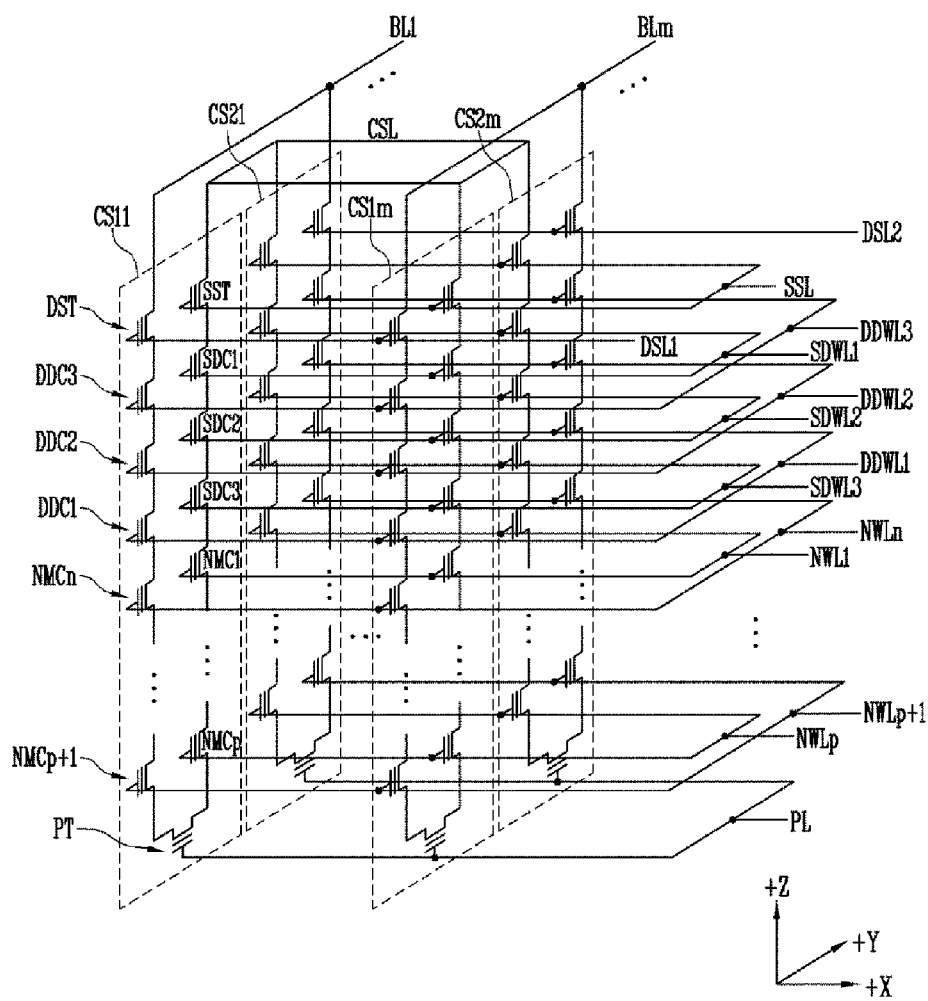
FIG. 3 is a circuit diagram representation of an embodiment of of the memory blocks shown in FIG. 2.

FIG. 3 is a circuit diagram representation of an embodiment of a memory block BLK1-BLKz shown in FIG. 2.

A first memory block BLK1 includes a plurality of cell strings CS11-CS1m, CS21-CS2m. In the first memory block BLK1, an m number of cell strings are arranged in a row direction (i.e., a +X direction). Two cell strings arranged in a column direction (i.e. +Y direction) are shown. 3. However, a p number of (p is a natural number) cell strings may be arranged in a column direction (i.e. +Y direction).

Each of the plurality of cell strings CS11-CS1$m$, CS21-CS2$m$ is formed in a U-shape. Each of the plurality of cell strings CS11-CS1$m$, CS21-CS2$m$ includes normal memory cells NMC1-NMCn, dummy memory cells SDC1-SDC3, DDC1-DDC3, a source select transistor SST, a drain select transistor DST, and a pipe transistor PT. The normal memory cells NMC1-NMCn, the dummy memory cells SDC1-SDC3, DDC1-DDC3, the source select transistor SST, the drain select transistor DST, and the pipe transistor PT are stacked above a substrate (not shown) under the memory block BLK1.

The select transistors SST, DST, the dummy memory cells SDC1-SDC3, DDC1-DDC3, and the normal memory cells NMC1-NMCn may all have substantially similar structures. For example, each of the select transistors SST, DST, the dummy memory cells SDC1-SDC3, and DDC1-DDC3, and the normal memory cells NMC1-NMCn may include a channel layer, a tunneling insulating layer, a charge storage layer, and a blocking insulating layer. The channel layer extends between a corresponding bit line and the common source line. The block insulating layer is electrically coupled to a corresponding row line The source select transistor SST of each cell string is commonly electrically coupled to the common source line CSL. The source select transistor SST of each cell string is electrically coupled between the common source line CSL and the source dummy memory cells SDC1-SDC3. A gate of the source select transistor SST of each cell string is commonly electrically coupled to a source select line SSL.

While a single source select transistor SST per each cell string is shown in FIG. 3, two or more source select transistors SST electrically coupled in series to each cell string may be used.

The source dummy memory cells SDC1-SDC3 of each cell string is electrically coupled between the source select transistors SST and the normal memory cells NMC1-NMCp. The gates of the first, second and third source dummy memory cells SDC1-SDC3 are electrically coupled to the first, second and third source dummy word lines SDWL1-SDWL3, respectively.

The first through $N^{th}$ normal memory cells NMC1-NMCn of each cell string are electrically coupled between the source dummy memory cells SDC1-SDC3 and the drain dummy memory cells DDC1-DDC3.

The first through $N^{th}$ normal memory cells NMC1-NMCn are divided into first through $P^{th}$ normal memory cells NMC1,-NMCp, and $(P+1)^{th}$ through $N^{th}$ normal memory cells NMCp+1, NMCn. The first through $P^{th}$ normal memory cells NMC1-NMCp, and the $(P+1)^{th}$ through $N^{th}$ normal memory cells NMCp+1-NMCn are electrically coupled via the pipe transistor PT. The first through $P^{th}$ normal memory cells NMC1-NMCp are sequentially arranged in a reverse +Z direction and electrically coupled in series between the source dummy memory cells SDC1-SDC3, and the pipe transistor PT. The $(P+1)^{th}$ through $N^{th}$ normal memory cells NMCp+1-NMCn are sequentially stacked in a +Z direction and electrically coupled in series between the pipe transistor PT and the drain dummy memory cells DDC1-DDC3. The gates of the first through $N^{th}$ normal memory cells NMC1-NMCn are electrically coupled to the first through $N^{th}$ normal word lines NWL1-NWLn, respectively.

The gate of the pipe transistor PT of each cell string is electrically coupled to the pipe line PL.

The drain dummy memory cells DDC1-DDC3 of each cell string are electrically coupled in series between the drain select transistor DST and the normal memory cells NMCp+1-NMCn. The gates of the first, second, and third drain dummy memory cells DDC1 to -DDC3 are electrically coupled to the first, second and third drain dummy word lines DDWL1-DDWL3, respectively.

The drain select transistor DST of each cell string is electrically coupled between a corresponding bit line and the drain dummy memory cells DDC1-DDC3. The drain select transistors DST of the cell strings CS11-CS1$m$ of a first row are electrically coupled to a first drain select line DSL1. The drain select transistors DST of the cell strings CS21-CS2$m$ of a second row are electrically coupled to a second drain select line DSL2.

The cell strings (e.g., CS11-CS1$m$) arranged in the same row (+X direction) are electrically coupled to the same drain select line (e.g., DSL1) via corresponding drain select transistors. The cell strings (e.g., CS11-CS21) arranged in different rows are electrically coupled to the different drain select lines (e.g., DSL1, DSL2).

Figure 4:
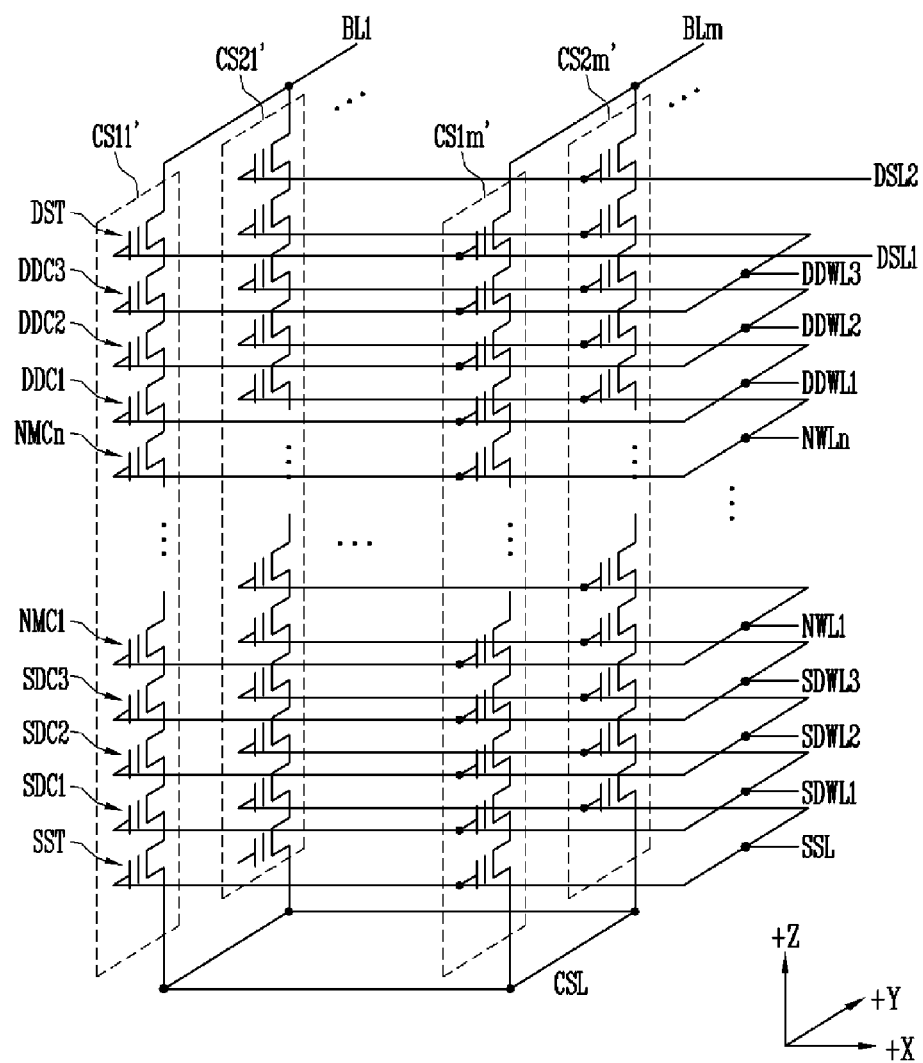
FIG. 4 is a circuit diagram representation of an embodiment of one of the memory blocks shown in FIG. 2.

FIG. 4 is a circuit diagram representation of an embodiment BLK1' of a (BLK1) memory block BLK1, BLKz shown in FIG. 2.

A first memory block BLK1' includes a plurality of cell strings CS11'-CS1$m$', CS21'-CS2$m$'. In the first memory block BLK1', an m number of cell strings are arranged in a row direction (i.e., +X direction). Two cell strings arranged in the column direction are shown in FIG. 4. However, a p number of (where p is a natural number) cell strings may be arranged in a column direction (i.e., +Y direction).

Each of the plurality of cell strings CS11'-CS1$m$', CS21'-CS2$m$' extends along the +Z direction. Each of the plurality of cell strings CS11'-CS1$m$', and CS21'-CS2$m$' includes a source select transistor SST, dummy memory cells SDC1-SDC3, DDC1, DDC3, first through $n^{th}$ normal memory cells NMC1-NMCn, and a drain select transistor DST. The source select transistor SST, the dummy memory cells SDC1-SDC3, DDC1, DDC3, the first through $n^{th}$ normal memory cells NMC1-NMCn, and the drain select transistor DST are stacked above a substrate (not shown) under the memory block BLK1'.

The source select transistor SST of each cell string is commonly electrically coupled to a common source line CSL. The source select transistor SST of each cell string is electrically coupled between the source dummy memory cells SDC1-SDC3 and the common source line CSL. The gate of the source select transistor SST of each cell string is electrically coupled to a source select line SSL.

The source dummy memory cells SDC1-SDC3 of each cell string are electrically coupled in series between the normal memory cells NMC1-NMCn and the source select transistor SST. The source dummy memory cells having substantially the same height are electrically coupled to the same dummy word line. The gates of the first, second and third source dummy memory cells SDC1-SDC3 are electrically coupled to first, second and third source dummy word lines SDWL1-SDWL3, respectively.

The first through $N^{th}$ normal memory cells NMC1-NMCn of each cell string are electrically coupled in series between the source dummy memory cells SDC1-SDC3 and the drain dummy memory cells DDC1-DDC3. The normal memory cells having substantially the same height are electrically coupled to the same normal word line. The first through $N^{th}$ normal memory cells NMC1-NMCn are electrically coupled to first through $N^{th}$ normal word lines NWL1-NWLn, respectively.

The drain dummy memory cells DDC1-DDC3 of each cell string are electrically coupled in series between the drain select transistor DST and the normal memory cells NMC1-NMCn. The first, second and third drain dummy memory cells DDC1-DDC3 are electrically coupled to first, second and third drain dummy word lines DDWL1-DDWL3, respectively.

The drain select transistor DST of each cell string is electrically coupled between a corresponding bit line and the drain dummy memory cells DDC1-DDC3. The drain select transistors of the cell strings arranged in the same row (+X direction) are electrically coupled to the same drain select line. The drain select transistors DST of the cell strings CS11'-CS1m' of a first row are electrically coupled to a first drain select line DSL1. The drain select transistors DST of the cell strings CS21'-CS2m' of a second row are electrically coupled to a second drain select line DSL2.

In FIG. 4, the first through $m^{th}$ cell strings CS11'-CS1m', or CS21'-CS2m' arranged in a row direction are electrically coupled to first through $m^{th}$ bit lines BL1-BLm, respectively. In an embodiment, even bit lines and odd bit lines may be used instead of the first through $m^{th}$ bit lines BL1-BLm. Even-numbered cell strings among the cell strings CS11'-CS1m', or CS21'-CS2m' arranged in a row direction may be electrically coupled to the even bit lines, respectively, and odd-numbered cell strings among the cell strings CS11'-CS1m', or CS21'-CS2m' arranged in a row direction may be electrically coupled to the odd bit lines, respectively.

The memory block BLK1' shown in FIG. 4 and the memory block BLK1 shown in FIG. 3 have substantially similar circuits except that a pipe transistor PT is excluded in each cell string.

Figure 5:
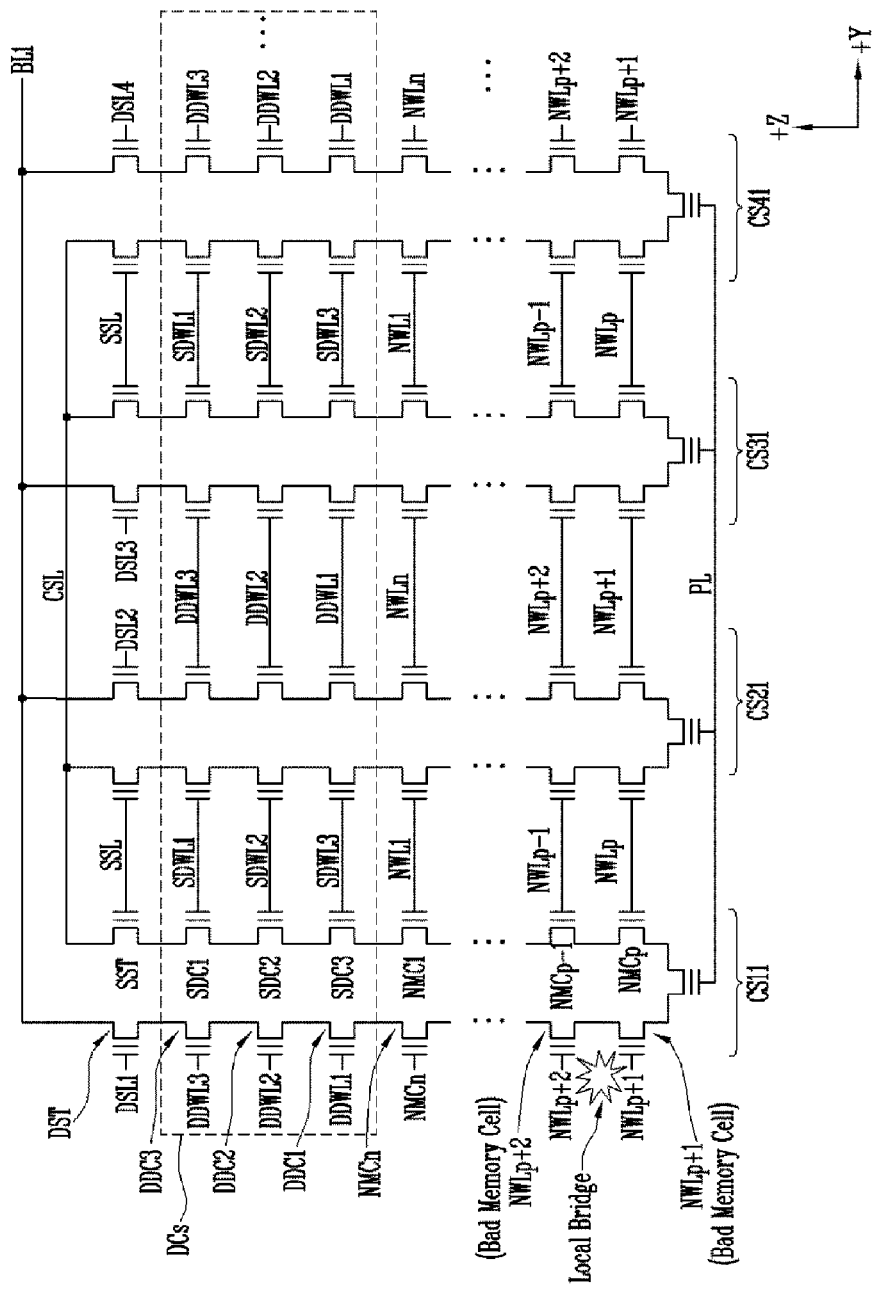
FIG. 5 is a circuit diagram representation of cell strings arranged in a column direction in a memory block shown in FIG. 3.

FIG. 5 is a circuit diagram representation of cell strings CS11-CS41 arranged in a column direction (+Y direction) in the memory block BLK1 shown in FIG. 3. In FIG. 5, the cell strings CS11-CS41 are electrically coupled to a first bit line BL1 as an example. In FIG. 5, four cell strings CS11-CS41 arranged in a column direction are used. However, the number of cell strings in the memory block BLK1 in a column direction may vary.

A local bridge may occur between two normal word lines NWLp+1, NWLp+2 in an area adjacent to the cell string CS11. The local bridge may cause a relatively weak leakage current between the $(p+1)^{th}$ and the $(p+2)^{th}$ normal word lines NWLp+1, NWLp+2. The local bridge may affect an area adjacent to the cell string CS11 between the $(p+1)^{th}$ and the $(p+2)^{th}$ normal word lines NWLp+1, NWLp+2. For example, the voltages provided to the $(p+1)^{th}$ and the $(p+2)^{th}$ normal word lines NWLp+1, NWLp+2 via the address decoder 121 (shown in FIG. 1) have a relatively greatly change in the area adjacent to the cell string CS11 and are relatively unchanged in an area adjacent to the other cell strings CS21-CS41.

A voltage of the $(p+1)^{th}$ normal word line NWLp+1 and a voltage of the $(p+2)^{th}$ normal word line NWLp+2 may be unintentionally altered due to the leakage current. For example, it is assumed that a relatively higher program voltage is applied to the selected $(p+1)^{th}$ normal word line NWLp+1, and a program pass voltage that is relatively lower than the program voltage is applied to the non-selected $(p+2)^{th}$ normal word line NWLp+2. A voltage applied to a gate of the $(p+1)^{th}$ normal word line NMCp+1 of the cell string CS11 may be unintentionally relatively lower than the program voltage, and a voltage applied to a gate of the $(p+2)^{th}$ normal word line NMCp+2 of the cell string CS11 may be unintentionally relatively higher than the program pass voltage. For example, it is assumed that a read voltage is applied to the selected $(p+1)^{th}$ normal word line NWLp+1, and a read pass voltage that is relatively higher than the read voltage is applied to the non-selected $(p+2)^{th}$ normal word line NWLp+2. A voltage applied to the gate of the $(p+1)^{th}$ normal word line NMCp+1 of the cell string CS11 may be unintentionally relatively higher than the read voltage, and a voltage applied to the gate of the $(p+2)^{th}$ normal word line NMCp+2 of the cell string CS11 may be unintentionally relatively lower than the read pass voltage.

If bad memory cells caused by the local bridge are invalidated as preventing a relative degradation of the reliability of the semiconductor memory device 100, a storage space of the cell string CS11 may be smaller. Therefore, a storage space of the memory block BLK1 may be relatively smaller than the storage space of other memory blocks. This may causes difficulties in managing an address of the memory block BLK1.

In an embodiment, when bad memory cells exist among the normal memory cells, the bad memory cells are processed as a bad area and are replaced with dummy memory cells DCs. As the bad memory cells in a memory block are replaced with dummy memory cells DCs in the same memory block, the bad memory cells may be processed as a bad area, and the storage space of the corresponding memory block BLK1 may be maintained as being substantially the same as other memory blocks.

Figure 6:
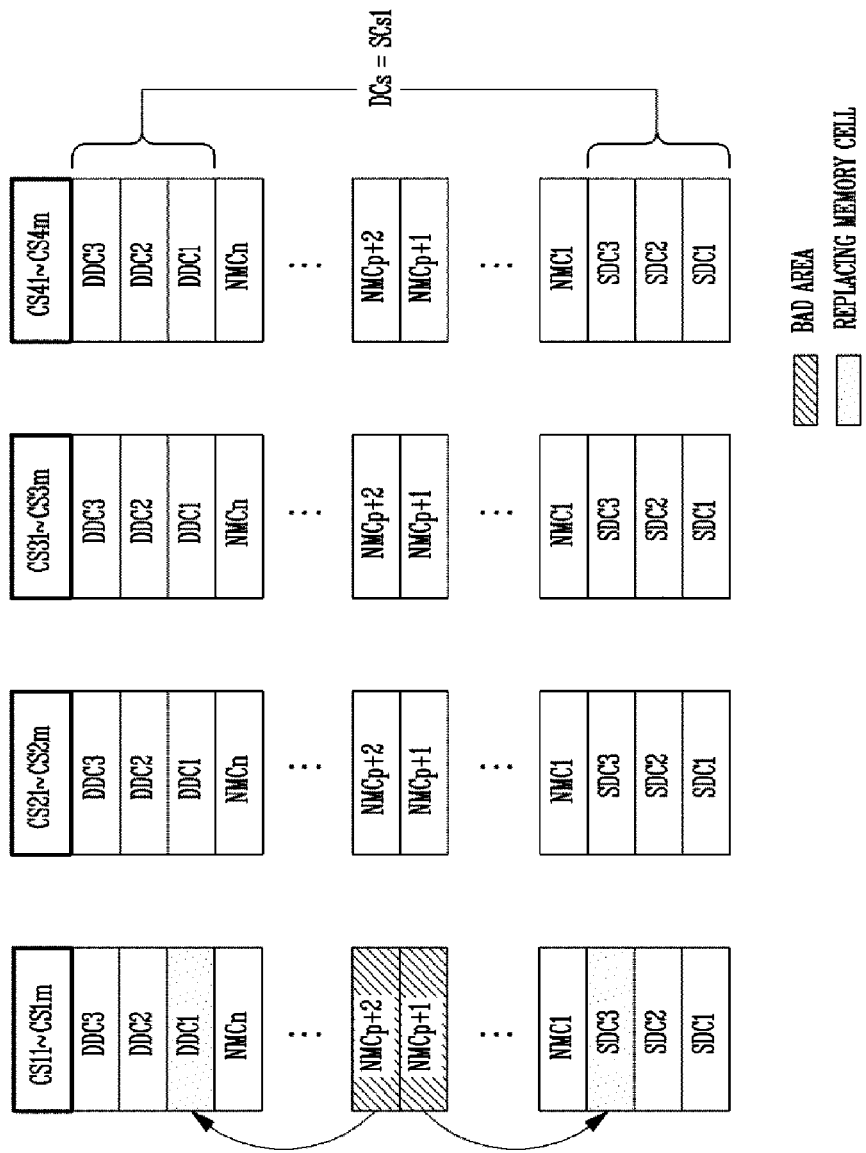
FIG. 6 is an illustration of an embodiment of the cell strings of a row and the dummy memory cells and the normal memory cells included in each cell string.

FIG. 6 is an illustration of the cell strings of each row, the dummy memory cells DCs and the normal memory cells NMC1-NMCn included in each cell string. An embodiment of a method of replacing bad memory cells is described with reference to FIG. 6.

The dummy memory cells SDC1-SDC3, DDC1-DDC3 (DCs) of the cell strings CS11-CS1m, CS21-CS2m, CS31-CS3m, CS41-CS4m may be used as spare cells SCs for replacing bad memory cells.

It is assumed that bad memory cells occur among the normal memory cells of the cell strings CS11-CS1m of a first row. For example, the $(p+1)^{th}$ and the $(p+2)^{th}$ normal memory cells NMCp+1, NMCp+2 of the cell string CS11 of a first column from among the cell strings CS11-CS1m of the first row may be the bad memory cells. In this case, normal memory cells electrically coupled to the same normal word line as the bad memory cells from among the cell strings CS11-CS1m of the first row may be processed as a bad area and may be replaced with dummy memory cells DCs. The $(p+1)^{th}$ normal memory cells NMCp+1 of the cell strings CS11-CS1m, and the $(p+2)^{th}$ normal memory cells NMCp+2 of the cell strings CS11-CS1m will be processed as a bad area. The bad area may have relatively lower reliability, and memory cells in the bad area are not used.

For example, as shown in FIG. 6, the $(p+1)^{th}$ normal memory cells NMCp+1 of the cell strings CS11-CS1m of the first row may be replaced with third source dummy memory cells SDC3 of the cell strings CS11-CS1m of the same row. The $(p+2)^{th}$ normal memory cells NMCp+2 of the cell strings CS11-CS1m of the first row may be replaced with first drain dummy memory cells DDC1 of the cell strings CS11-CS1m of the same row. In addition, the $(p+1)^{th}$ normal memory cells NMCp+1 of the cell strings CS11-CS1m, and the $(p+2)^{th}$ normal memory cells NMCp+2 of the cell strings CS11-CS1m of the first row may be replaced with spare cells SCs1 using various methods. In an example, the $(p+1)^{th}$ normal memory cells NMCp+1 of the cell strings CS11-

CS1m of the first row may be replaced with third source dummy memory cells SDC3 of the cell strings (e.g., CS21-CS2m) of another row. The (p+2)$^{th}$ normal memory cells NMCp+2 of the cell strings CS11-CS1m of the first row may be replaced with first drain dummy memory cells DDC1 of the cell strings (e.g., CS21-CS2m) of another row.

Figure 7:
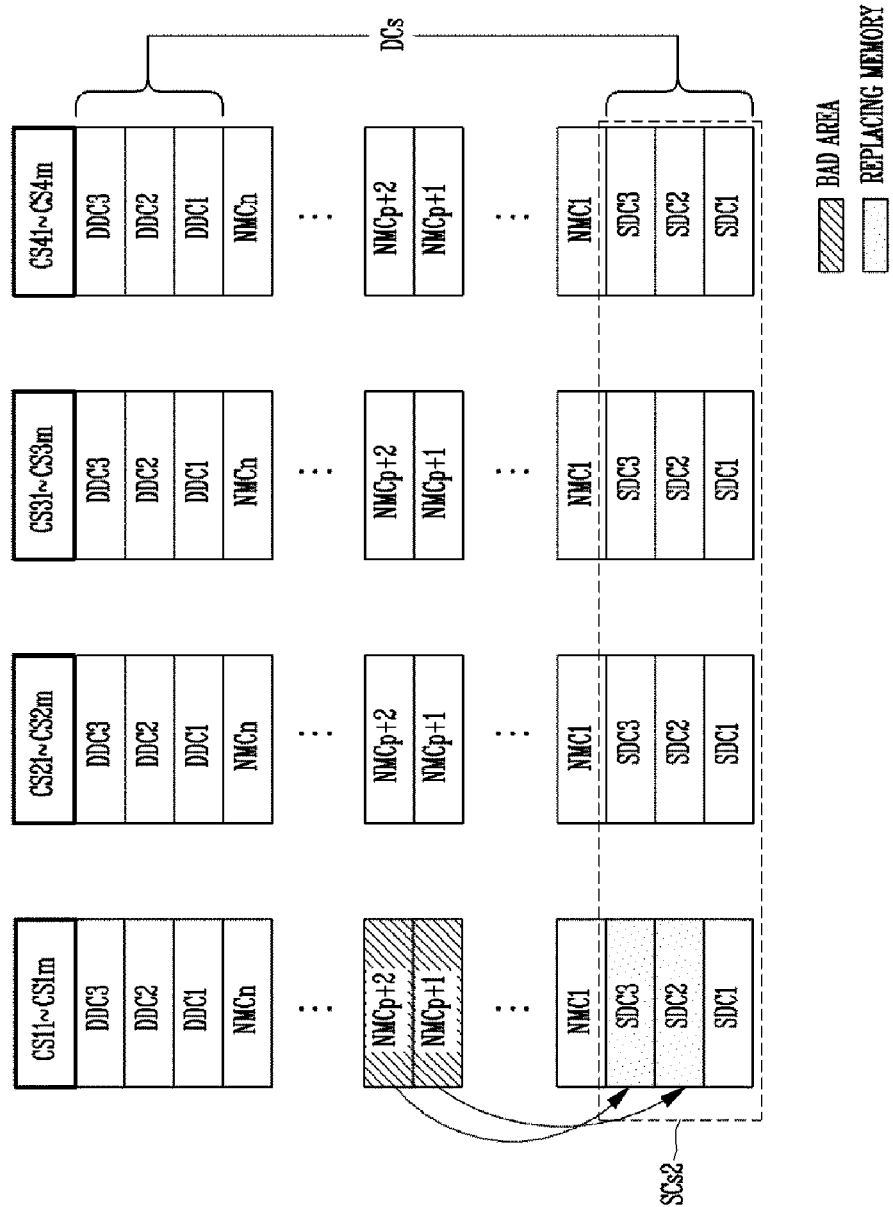
FIG. 7 is an illustration of an embodiment of the cell strings of a row and the dummy memory cells and the normal memory cells included in each cell string.

FIG. 7 is an illustration of the cell strings of each row, the dummy memory cells DCs and the normal memory cells NMC1-NMCn included in each cell string. An embodiment of a method of replacing bad memory cells is described below.

When a program operation of the semiconductor memory device 100 is performed, a power voltage may be applied to the common source line CSL (see FIGS. 3 and 4), and the power voltage or a ground voltage may be applied to the bit lines BL1-BLm (see FIGS. 3 and 4) depending on the data to be programmed. When the cell strings are electrically coupled to a non-selected drain select line, a voltage of the corresponding channel is boosted when the program operation is performed. When the cell string receives a ground voltage via a bit line, a difference between the ground voltage received via the bit line and the boosted channel voltage is relatively greater than a difference between the power voltage received via the common source line and the boosted channel voltage. Therefore, a current has a relatively highly likelihood of leaking through the drain select transistor DST (see FIGS. 3 and 4) from the boosted channel. In order to address such a problem, several drain dummy memory cells DDC1-DDC3 may be used to gradationally reduce a voltage of the channel located and boosted between the normal memory cells NMC1-NMCn and the drain select transistor DST, from the boosted channel to the corresponding bit line.

Referring back to FIG. 7, the drain dummy memory cells DDC1-DDC3 from among the dummy memory cells DCs may not be used as spare cells SCs. The source dummy memory cells SDC1-SDC3 from among the cell strings CS11-CS1m, CS21-CS2m, CS31-CS3m, CS41-CS4m are used as the spare cells SCs for replacing bad memory cells.

It is assumed that the (p+1)$^{th}$ and the (p+2)$^{th}$ normal memory cells NMCp+1, NMCp+2 of the cell string CS11 of a first column from among the cell strings CS11-CS1m of a first row are bad memory cells. In such a case, the (p+1)$^{th}$ normal memory cells NMCp+1 of the cell strings CS11-CS1m of the first row, and the (p+2)$^{th}$ normal memory cells NMCp+2 of the cell strings CS11-CS1m of the first row may be processed as a bad area and replaced with spare cells SCs2.

For example, as shown in FIG. 7, the (p+1)$^{th}$ normal memory cells NMCp+1 of the cell strings CS11-CS1m of the first row may be replaced with second source dummy memory cells SDC2 of the cell strings CS11-CS1m of the same row. The (p+2)$^{th}$ normal memory cells NMCp+2 of the cell strings CS11-CS1m of the first row may be replaced with third source dummy memory cells SDC3 of the cell strings CS11-CS1m of the same row. In an example, the (p+1)$^{th}$ normal memory cells NMCp+1 of the cell strings CS11-CS1m of the first row may be replaced with second source dummy memory cells SDC2 of the cell strings (e.g., CS21-CS2m) of another row. The (p+2)$^{th}$ normal memory cells NMCp+2 of the cell strings CS11-CS1m of the first row may be replaced with third source dummy memory cells SDC3 of the cell strings (e.g., CS21-CS2m) of another row.

The (p+1)$^{th}$ normal memory cells NMCp+1 and the (p+2)$^{th}$ normal memory cells NMCp+2 of the cell strings CS11-CS1m of the first row may be replaced with spare cells SCs2 using various methods.

Figure 8:
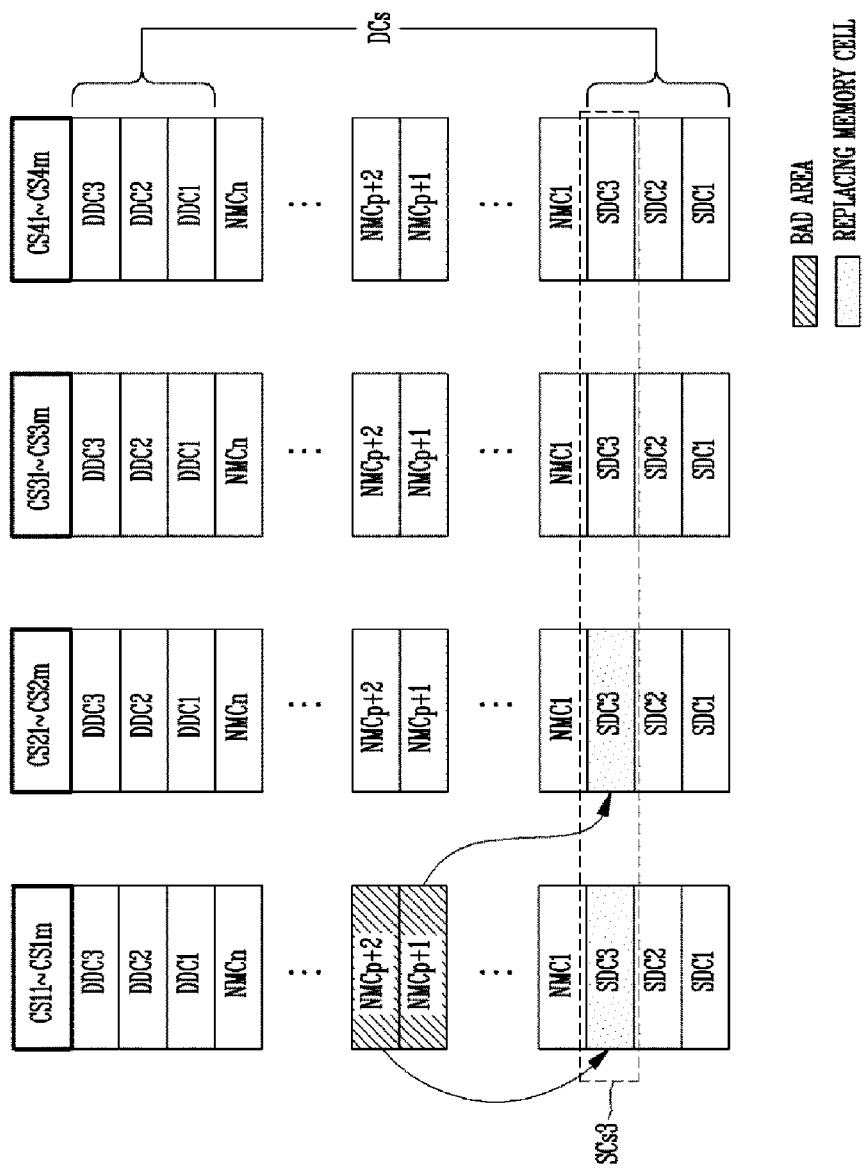
FIG. 8 is an illustration of an embodiment of the cell strings of a row and the dummy memory cells and the normal memory cells included in each cell string.

FIG. 8 is an illustration of the cell strings of each row, the dummy memory cells DCs and the normal memory cells NMC1-NMCn included in each cell string. An embodiment of a method of replacing bad memory cells is described below.

When a program operation is performed, voltages applied to the gates of source dummy memory cells SDC1-SDC3 may be reduced while the corresponding source dummy memory cells are adjacent to the common source line CSL (see FIGS. 3 and 4) in order to reduce gradationally a channel voltage of a boosted cell string from the channel of the cell string to the source select transistor SST (see FIGS. 3 and 4).

Third source dummy memory cells SDC3 adjacent to normal memory cells NMC1-NMCn from among cell strings CS11-CS1m, CS21-CS2m, CS31-CS3m, CS41-CS4m may be used as spare cells SCs. Source dummy memory cells SDC1-SDC2 that are not adjacent to the normal memory cells NMC1-NMCn may not be used as spare cells SCs.

In a case where the bad memory cells are replaced with third source dummy memory cells SDC3 of the cell strings CS11-CS1m, CS21-CS2m, CS31-CS3m, CS41-CS4m when a program operation is performed, a program voltage or a program pass voltage is applied to a third source dummy word line SDWL3 (see FIGS. 3 and 4) like the normal memory cells NMC1-NMCn. The closer the corresponding source dummy word line is to the common source line CSL, the greater the reduction in the voltages applied to first and second source dummy word lines SDWL1, SDWL2.

It is assumed that the (p+1)$^{th}$ and the (p+2)$^{th}$ normal memory cells NMCp+1, NMCp+2 of the cell string CS11 of a first column from among the cell strings CS11-CS1m of a first row are bad memory cells. The (p+1)$^{th}$ normal memory cells NMCp+1 of the cell strings CS11-CS1m of the first row, and the (p+2)$^{th}$ normal memory cells NMCp+2 of the cell strings CS11-CS1m of the first row may be processed as a bad area and replaced with spare cells SCs3. For example, as shown in FIG. 8, the (p+1)$^{th}$ normal memory cells NMCp+1 of the cell strings CS11-CS1m of the first row may be replaced with third source dummy memory cells SDC3 of the cell strings (e.g., CS21-CS2m) of another row. The (p+2)$^{th}$ normal memory cells NMCp+2 of the cell strings CS11-CS1m of the first row may be replaced with third source dummy memory cells SDC3 of the cell strings CS11-CS1m of the same row. In an example, the (p+1)$^{th}$ normal memory cells NMCp+1 of the cell strings CS11-CS1m of the first row may be replaced with third source dummy memory cells SDC3 of the cell strings (e.g., CS21-CS2m) of another row. The (p+2)$^{th}$ normal memory cells NMCp+2 of the cell strings CS11-CS1m of the first row may be replaced with third source dummy memory cells SDC3 of the cell strings (e.g., CS31-CS3m) of a still another row.

FIG. 9 is a table detailing the voltages that are applied to the dummy word lines SDWL1-SDWL3, DDWL1-DDWL3, and to the normal word lines NWL1-NWLn when a program operation or a read operation is performed following the replacement of the bad memory cells in accordance with the method described with reference to FIG. 8. It is assumed that a bad area including bad memory cells is replaced with source dummy memory cells electrically coupled to the third source dummy word line SDWL3, and that the third source dummy word line SDWL3 is selected in FIG. 9.

When a program operation is performed, first and second program dummy voltages Vpdm1, Vpdm2 are applied to first and second source dummy word lines SDWL1, SDWL2. The first and second program dummy voltages Vpdm1, Vpdm2 are relatively lower than a program voltage Vpgm and a program pass voltage Vppass. The first program dummy voltage Vpdm1 may be relatively lower than the second program dummy voltage Vpdm2. The program dummy voltages Vpdm1, Vpdm2 may be relatively higher while the corresponding source dummy word line is adjacent to the normal word lines NWL1-NWLn.

When a program operation is performed, the relatively higher program voltage Vpgm is applied to the third source dummy word line SDWL3.

The same program pass voltage Vppass is applied to the normal word lines NWLp+1, NWLp+2 that are electrically coupled to the bad memory cells. Since substantially the same voltage is applied to the normal word lines NWLp+1, NWLp+2 having caused a local bridge, voltages of the normal word lines NWLp+1, NWLp+2 may not experience an unintentional change. Similarly, the program pass voltage Vppass is applied to other normal word lines NWL1-NWLp, NWLp+3-NWLn.

The second program dummy voltage Vpdm2 is applied to the first drain dummy word line DDWL1, the first program dummy voltage Vpdm1 is applied to the second drain dummy word line DDWL2, and a $0^{th}$ program dummy voltage Vpdm0 is applied to the third drain dummy word line DDWL3. The $0^{th}$ program dummy voltage Vpdm0 may be relatively lower than the first and second program dummy voltages Vpdm1, Vpdm2.

When a read operation is performed, first and second read dummy voltages Vrdm1, Vrdm2 are applied to the first and second source dummy word lines SDWL1, SDWL2, respectively. The first and second read dummy voltages Vrdm1, Vrdm2 are relatively lower than a read pass voltage Vrpass. The first read dummy voltage Vrdm1 may be relatively lower than the second read dummy voltage Vrdm2.

When a read operation is performed, a read voltage Vread is applied to the third source dummy word line SDWL3. Data of the source dummy memory cells selected according to the read voltage Vread is determined.

The same read pass voltage Vrpass is applied to the normal word lines NWLp+1, NWLp+2 that are electrically coupled to the bad area. Similarly, the high read pass voltage Vrpass is applied to other normal word lines NWL1-NWLp, NWLp+3-NWLn.

The second read dummy voltage Vrdm2 is applied to the first drain dummy word line DDWL1, the first read dummy voltage Vrdm1 is applied to the second drain dummy word line DDWL2, and a $0^{th}$ read dummy voltage Vrdm0 is applied to the third drain dummy word line DDWL3. The $0^{th}$ read dummy voltage Vrdm0 may be relatively lower than the first and second read dummy voltages Vrdm1, Vrdm2.

FIG. 10 is a table detailing the voltages that are applied to the dummy word lines SDWL1, SDWL3, DDWL1-DDWL3 and to the normal word lines NWL1-NWLn when an erase operation is performed following the replacement of the bad memory cells are replaced in accordance with the method described with reference to FIG. 8.

A ground voltage Vss is applied to the normal word lines NWLp+1, NWLp+2 that are electrically coupled to bad memory cells like other normal word lines NWL1-NWLp, and NWLp+3-NWLn.

Figure 11:
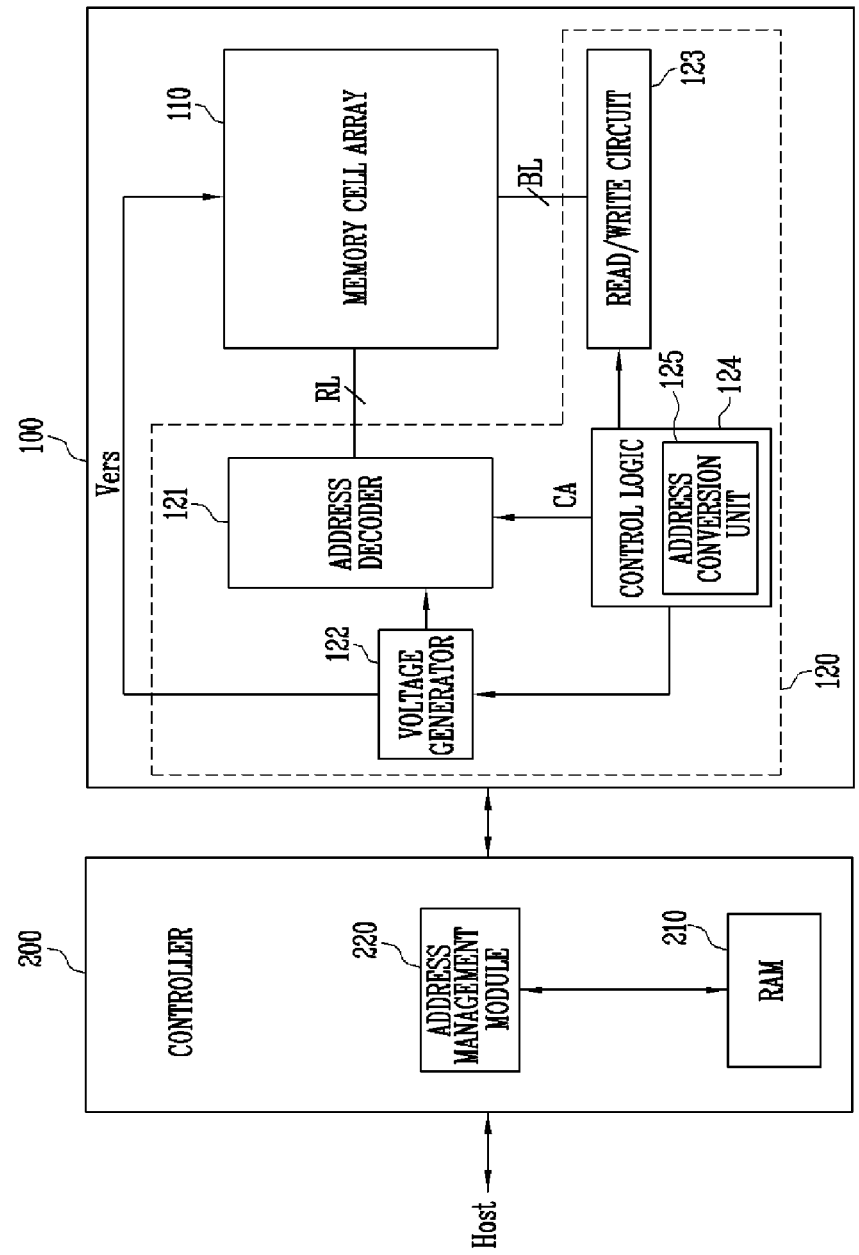
FIG. 11 is a block diagram representation of a memory system including a semiconductor memory device and a controller.

FIG. 11 is a block diagram representation of a memory system including a semiconductor memory device 100 and a controller 200.

The controller 200 is electrically coupled to a host Host and the semiconductor memory device 100. The controller 200 is configured to access the semiconductor memory device 100 in response to a request from the host Host. For example, the controller 200 is configured to control one or more operations including but not limited to read operations, program operations, erase operations, and background operations of the semiconductor memory device 100.

The controller 200 is configured to provide an interface between the semiconductor memory device 100 and the host Host. The controller 200 is configured to drive firmware for controlling the operation of the semiconductor memory device 100.

The controller 200 is configured to communicate with the semiconductor memory device 100 through a channel. The controller 200 is configured to transmit the command CMD (see FIG. 1) and the physical address ADDR (see FIG. 1) to the semiconductor memory device 100. The semiconductor memory device 100 performs the read, program and erase operations in accordance with the command CMD. The semiconductor memory device 100 programs data in an area corresponding to the physical address ADDR, reads data from the area corresponding to the physical address ADDR, or erases data of the area corresponding to the physical address ADDR.

The controller 200 includes a random access memory (RAM) 210 and an address management module 220.

A mapping table including a mapping relationship between a logical block address received from the host Host, and a physical address ADDR provided to the semiconductor memory device 100 and stored in the RAM 210.

The address management module 220 converts the logical address received from the host Host into the physical address ADDR (see FIG. 1) with using the mapping table. The address management module 220 manages a bad area of a memory cell array 110 by managing the mapping table of the RAM 210. For example, the address management module 220 does not map a physical address corresponding to the bad area to a logical address, but maps a physical address indicating the dummy memory cells, that replaces the bad area, to a corresponding logical address. The address management module 220 may convert the logical address received from the host Host into the physical address indicating the corresponding dummy memory cells. The physical address is transmitted to the semiconductor memory device 100.

For example, when a program operation fails in the semiconductor memory device 100, the address management module 220 may detect that bad memory cells are present in selected normal memory cells. When a read operation is performed, the address management module 220 may detect that the bad memory cells are in the selected normal memory cells using an error correction block 1250 (see FIG. 12) that may be included in the controller 200.

The address management module 220 updates the mapping table stored in the RAM 210 to enable the processing of the normal memory cells in a bad area and replace the normal memory cells in the bad area with dummy memory cells.

Figure 12:
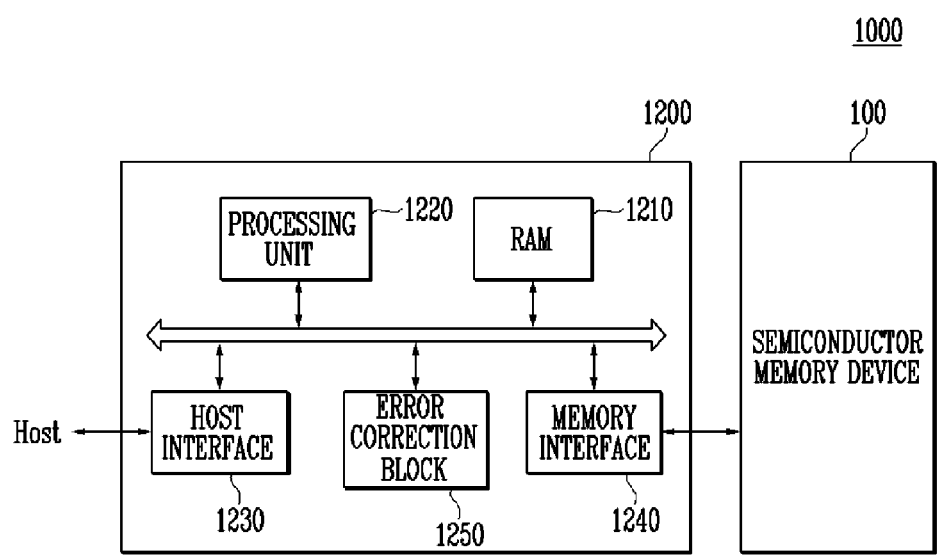
FIG. 12 is a block diagram representation of an embodiment of the memory system shown in FIG. 11.

FIG. 12 is a block diagram representation of an embodiment of a memory system 1000.

The memory system 1000 includes a semiconductor memory device 100 and a controller 1200.

The semiconductor memory device 100 is configured to operate in substantially the same manner as the semiconductor memory device described with reference to FIGS. 1 to 8.

The controller 1200 is electrically coupled to a host Host and to the semiconductor memory device 100. The controller 1200 is configured to access the semiconductor memory device 100 in response to a request from the host Host. For example, the controller 1200 is configured to control one or more operations of the semiconductor memory device 100 including but not limited to read operations, write operations, erase operations, and background operations of the semiconductor memory device 100. The controller 1200 is configured to provide an interface between the semiconductor memory device 100 and the host Host. The controller 1200 is configured to drive firmware to control one or more operations of the semiconductor memory device 100.

The controller 1200 includes a random access memory (RAM) 1210, a processing unit 1220, a host interface 1230, a memory interface 1240, and the error correction block 1250.

The RAM 1210 is used as at least one of an operational memory of the processing unit 1220, a cache memory between the semiconductor memory device 100 and the host Host, and a buffer memory between the semiconductor memory device 100 and the host Host. The processing unit 1220 controls an overall operation of the controller 1200.

The RAM 1210 may perform a function of the RAM 210 (see FIG. 11). Furthermore, the processing unit 1220 may perform a function of the address management module 220 described with reference to FIG. 11.

The host interface 1230 includes a protocol to exchange data between the host Host and the controller 1200. In an embodiment, the controller 1200 is configured to communicate with the host Host using at least one of a number of different interface protocols such as a Universal Serial Bus (USB) protocol, a MultiMediaCard (MMC) protocol, a Peripheral Component Interconnect (PCI) protocol, a PCI-Express (PCI-E) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, a private protocol, and the like.

The memory interface 1240 interfaces with the semiconductor memory device 100. Examples of the memory interface 1240 include but are not limited to a NAND interface and a NOR interface.

The error correction block 1250 is configured to detect and correct an error associated with data received from the semiconductor memory device 100 using an error correcting code (ECC).

When the number of error bits exceeds the limited number in data read from selected normal memory cells, the error correction block 1250 cannot correct the error bits. When the number of error bits exceed the limited number, the error correction block 1250 transmits a fail signal to the processing unit 1220 that operates as the address management module 220. The processing unit 1220 updates a mapping table stored in the RAM 1210 in response to the fail signal.

The controller 1200 and the semiconductor memory device 100 may be integrated into a single semiconductor device. In an embodiment, the controller 1200 and the semiconductor memory device 100 may be integrated into a single semiconductor device configured as a memory card. The controller 1200 and the semiconductor memory device 100 may be integrated into a single semiconductor device configured as a memory card where examples of such memory cards include but are not limited to a personal computer (PC) card (personal computer memory card international association (PCMCIA)), a compact flash (CF) card, a smartmedia (SM) card (SMC), a memory stick, an MMC (reduced size MMC (RS-MMC), MMCmicro), a secure digital (SD) card (miniSD, microSD, SD high capacity (SDHC)), and a universal flash storage (UFS).

The controller 1200 and the semiconductor memory device 100 may be integrated into a single semiconductor device configured as a solid state drive (SSD). The SSD includes a storage device configured to store data in a semiconductor memory. When the memory system 1000 is used as a SSD, an operation speed of the host Host electrically coupled to the memory system 1000 may be enhanced.

The memory system 1000 may be used as a component of an electronic device, where examples of such electronic devices include but are not limited to a computer, an ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for wirelessly sending and receiving information, at least one of various electronic devices configuring a home network, at least one of various electronic devices configuring a computer network, at least one of various electronic devices configuring a telematics network, an RFID device, and at least one of various components for configuring a computing system.

In an embodiment, the semiconductor memory device 100 or the memory system 1000 may be mounted using various forms of packages. Examples of such packages include but are not limited to a package on package (PoP), ball grid arrays (BGAs), chip scale packages (CSPs), a plastic leaded chip carrier (PLCC), a plastic dual inline package (PDIP), a die in waffle pack, a die in wafer form, a chip on board (COB), a ceramic dual inline package (CERDIP), a plastic metric quad flat pack (MQFP), a thin quad flatpack (TQFP), a small outline integrated circuit (SOIC), a shrink small outline package (SSOP), a thin small outline package (TSOP), a thin quad flatpack (TQFP), a system in package (SIP), a multi chip package (MCP), a wafer-level fabricated package (WFP), and a wafer-level processed stack package (WSP).

Figure 13:
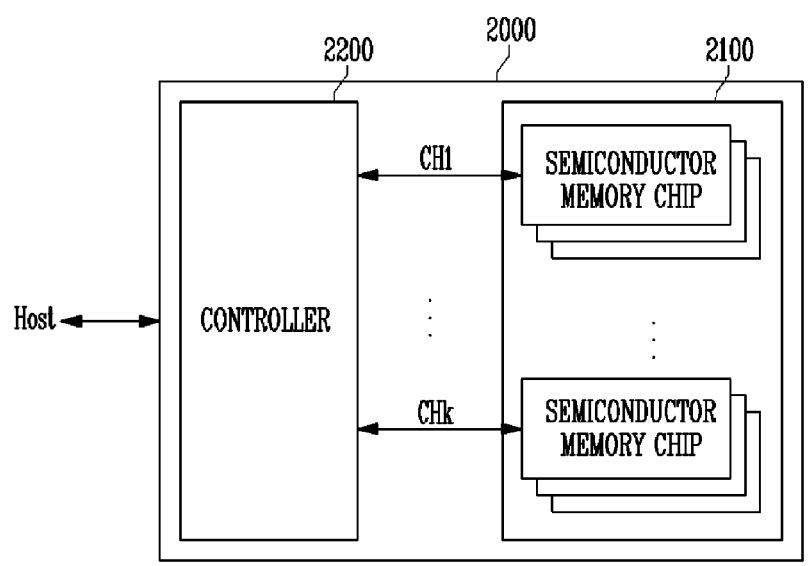
FIG. 13 is a block diagram representation of an example of an application of the memory system shown in FIG. 12.

FIG. 13 is a block diagram representation of an example of an application of the memory system 1000 shown in FIG. 12.

A memory system 2000 includes a semiconductor memory device 2100 and a controller 2200. The semiconductor memory device 2100 includes a plurality of semiconductor memory chips. The plurality of semiconductor memory chips are divided into a plurality of groups.

The plurality of groups of semiconductor memory chips communicate with the controller 2200 via first through kth channels CH1-CHk, respectively. Each semiconductor memory chip is configured and operates is a manner that is substantially similar to the semiconductor memory device 100 described with reference to FIG. 1.

Each group is configured to communicate with the controller 2200 via one common channel. The controller 2200 is configured in a manner that is substantially similar to the controller 1200 described with reference to FIG. 12 and is configured to control one or more operations of the plurality of semiconductor memory chips of the semiconductor memory device 2100 via the plurality of channels CH1-CHk.

The plurality of semiconductor memory chips are electrically coupled to a single channel. However, in an embodiment, a single semiconductor memory chip may be electrically coupled to a single channel.

Figure 14:
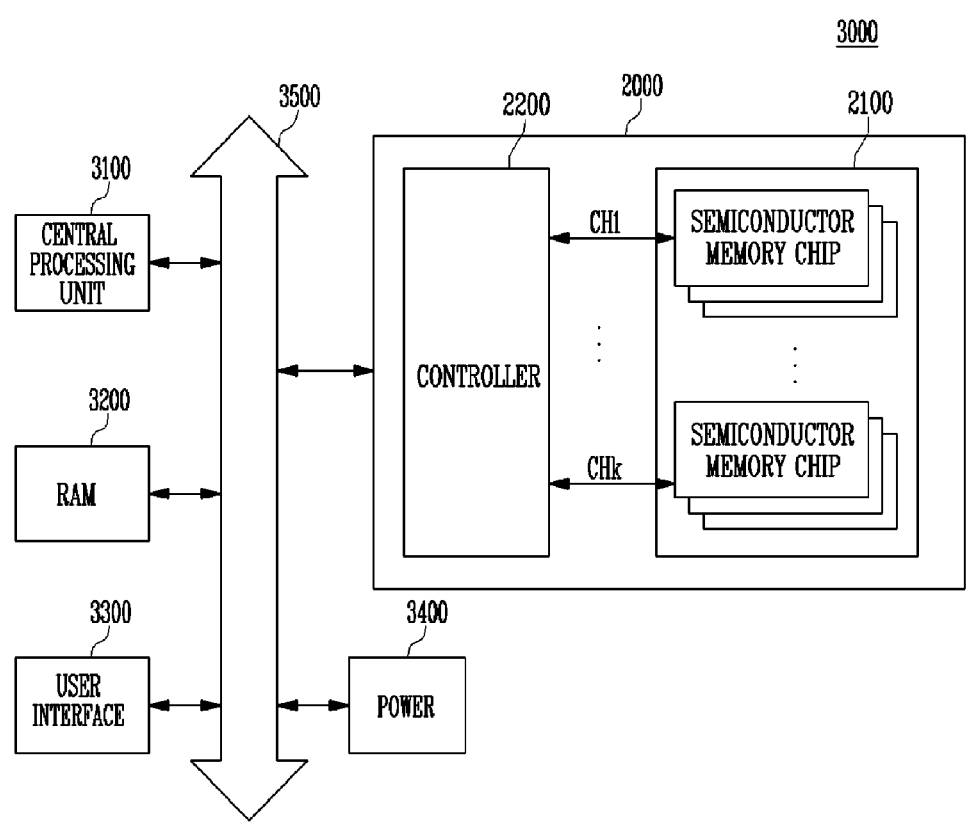
FIG. 14 is a block diagram representation of a computing system including the memory system described with reference to FIG. 13.

FIG. 14 is a block diagram representation of a computing system 3000 including the memory system 2000 described with reference to FIG. 13.

The computing system 3000 includes a central processing unit 3100, a RAM 3200, a user interface 3300, a power supply 3400, a system bus 3500 and the memory system 2000.

The memory system 2000 is electrically coupled to the central processing unit 3100, the RAM 3200, the user interface 3300, and the power supply 3400 via the system bus 3500. Data provided through the user interface 3300 or processed by the central processing unit 3100 is stored in the memory system 2000.

The semiconductor memory device 2100 is shown as being electrically coupled to the system bus 3500 via the controller 2200 in FIG. 14. However, the semiconductor memory device 2100 may be configured to be directly electrically coupled to the system bus 3500. The function of the controller 2200 may be performed by the central processing unit 3100 and the RAM 3200.

In FIG. 14, the memory system 2000 described with reference to FIG. 13 is provided. However, the memory system 2000 may be replaced with the memory system 1000 described with reference to FIG. 12. In an embodiment, the computing system 3000 may be configured to include both of the memory systems 1000, 2000 described with reference to FIGS. 12 and 13, respectively.

In an embodiment, the reliability of the semiconductor memory device may be increased and a relatively stable storage space may be maintained.

While certain embodiments have been described above, it will be understood to those skilled in the art that the embodiments described are by way of example only. Accordingly, the semiconductor memory devices, memory systems and operating methods described herein should not be limited based on the described embodiments. Rather, the semiconductor memory devices, memory systems and operating methods described herein should only be limited in light of the claims that follow when taken in conjunction with the above description and accompanying drawings.

What is claimed is:

1. A semiconductor memory device, comprising:
    a memory cell array including a plurality of cell strings arranged in a row direction and a column direction, wherein the cell strings include a first plurality of normal memory cells, a second plurality of dummy memory cells, drain select transistors, and source select transistors in a stacked configuration over a substrate;
    a first plurality of normal word lines electrically coupled to the first plurality of normal memory cells; and
    a second plurality of dummy word lines electrically coupled to the second plurality of dummy memory cells,
    wherein the second plurality of dummy memory cells include a second plurality of drain dummy memory cells electrically coupled to bit lines through the drain select transistors, and a second plurality of source dummy memory cells electrically coupled to a common source line through the source select transistors,
    wherein the first plurality of normal memory cells are electrically coupled between the drain dummy memory cells and the source dummy memory cells, and
    wherein a first bad memory cell included in a first cell string among the cell strings and coupled to a first normal word line is replaced with a first dummy memory cell included in the first cell string and coupled to a first dummy word line, and a second bad memory cell included in the first cell string and coupled to a second normal word line is replaced with a second dummy memory cell included in second cell string and coupled to the first dummy word line.

2. The device of claim 1, wherein each of the at least one bad memory cell is replaced with the source dummy memory cell adjacent to the first plurality of normal memory cells.

3. The device of claim 1, further comprising a peripheral circuit configured to control the operation of the first plurality of normal word lines and the second plurality of dummy word lines.

4. The device of claim 3, wherein, when a program operation is performed, the peripheral circuit is configured to apply a voltage to a normal word line that are electrically coupled to the at least one bad memory cell that is the same as the voltage applied to a non-selected normal word line from among the first plurality of normal word lines.

5. The device of claim 3, wherein, when a read operation is performed, the peripheral circuit is configured to apply a voltage to a normal word line that are electrically coupled to the at least one bad memory cell that is the same as the voltage applied to a non-selected normal word line from among the first plurality of normal word lines.

6. The device of claim 3, wherein, when an erase operation is performed, the peripheral circuit is configured to apply a ground voltage to a normal word line that are electrically coupled to the at least one bad memory cell.

7. A semiconductor memory device, comprising:
    a plurality of cell strings electrically coupled to a plurality of drain select lines, respectively, the plurality of drain select lines extending in a row direction and arranged in a column direction, each of the plurality of cell strings including a first plurality of normal memory cells, a second plurality of dummy memory cells, a drain select transistor, and a source select transistor in a stacked configuration over a substrate;
    a first plurality of normal word lines electrically coupled to the first plurality of normal memory cells; and
    a second plurality of dummy word lines electrically coupled to the second plurality of dummy memory cells,
    wherein the second plurality of dummy memory cells include a second plurality of drain dummy memory cells electrically coupled to bit lines through the drain select transistor, and a second plurality of source dummy memory cells electrically coupled to a common source line through the source select transistor,
    wherein the first plurality of normal memory cells are electrically coupled between the drain dummy memory cells and the source dummy memory cells, and
    wherein a first bad memory cell included in a first cell string and a first page is replaced with a first dummy memory cell included in the first cell string and a second page, and a second bad memory cell included in the first cell string and a third page is replaced with a second dummy memory cell included in a second cell string and the second page.

8. The device of claim 7, wherein the at least one bad memory cell is included in a first cell string from among the plurality of cell strings,
    a first bad memory cell from among the at least one bad memory cell is replaced with a dummy memory cell of the first cell string, and a second bad memory cell from among the at least one bad memory cell is replaced with a dummy memory cell of a second cell string from among the plurality of cell strings.

9. The device of claim 7, wherein the at least one bad memory cell is included in a first cell string from among the plurality of cell strings, a first bad memory cell from among the at least one bad memory cell is replaced with a dummy memory cell of a second cell string from among the plurality of cell strings, and a second bad memory cell among the at least one bad memory cell is replaced with a dummy memory cell of a third cell string from among the plurality of cell strings.

10. The device of claim 7, wherein the source dummy memory cell adjacent to the first plurality of normal memory cells from among the source dummy memory cells of each cell string is provided as a spare cell for replacing the at least one bad memory cell.

11. The device of claim 10, wherein the at least one bad memory cell is included in a first cell string from among the plurality of cell strings, a first bad memory cell from among the at least one bad memory cell is replaced with the spare cell of the first cell string, and a second bad memory cell from among the at least one bad memory cell is replaced with the spare cell of a second cell string from among the plurality of cell strings.

12. The device of claim 10, wherein the at least one bad memory cell is included in a first cell string from among the plurality of cell strings, a first bad memory cell from among the at least one bad memory cell is replaced with the spare cell of a second cell string from among the plurality of cell strings, and a second bad memory cell among the at least one bad memory cell is replaced with the spare cell of a third cell string from among the plurality of cell strings.

13. A memory system, comprising:
a semiconductor memory device; and
a controller configured to control at least one operation of the semiconductor memory device,
wherein the semiconductor memory device comprises:
a memory cell array including a plurality of cell strings arranged in a row direction and a column direction, wherein the cell strings include a first plurality of normal memory cells, a second plurality of dummy memory cells, drain select transistors, and source select transistors in a stacked over a substrate;
a first plurality of normal word lines electrically coupled to the first plurality of normal memory cells; and
second plurality of dummy word lines electrically coupled to the second plurality of dummy memory cells,
wherein the second plurality of dummy memory cells include a second plurality of drain dummy memory cells electrically coupled to bit lines through the drain select transistors, and a second plurality of source dummy memory cells electrically coupled to a common source line through the source select transistors,
wherein the first plurality of normal memory cells are electrically coupled between the drain dummy memory cells and the source dummy memory cells, and
wherein a first bad memory cell included in a first cell string among the cell strings and coupled to a first normal word line is replaced with a first dummy memory cell included in the first cell string and coupled to a first dummy word line, and a second bad memory cell included in the first cell string and coupled to a second normal word line is replaced with a second dummy memory cell included in second cell string and coupled to the first dummy word line.

14. The system of claim 13, wherein each of the at least one bad memory cells is replaced with the source dummy memory cell adjacent to the first plurality of normal memory cells.

15. The system of claim 13, wherein the controller is configured to convert a logical address received from an external device into a physical address that indicates a dummy memory cell from among the drain dummy memory cells and the source dummy memory cells.

* * * * *